United States Patent [19]

Tagawa

[11] 4,104,599
[45] Aug. 1, 1978

[54] CRYSTAL OSCILLATING CIRCUIT

[75] Inventor: Masatoshi Tagawa, Tokyo, Japan

[73] Assignee: Trio Kabushiki Kaisha, Tokyo, Japan

[21] Appl. No.: 782,897

[22] Filed: Mar. 30, 1977

[30] Foreign Application Priority Data

Apr. 20, 1976 [JP] Japan ............................. 51-49516[U]

[51] Int. Cl.² ............................................. H03B 5/36
[52] U.S. Cl. ............................... 331/116 R; 331/158; 331/177 V
[58] Field of Search .................... 331/116 R, 158, 159, 331/164, 177 V, 36 C; 332/26, 30 V; 334/15

[56] References Cited

U.S. PATENT DOCUMENTS

| | | | |
|---|---|---|---|
| 3,477,039 | 11/1969 | Chan | 331/116 R |
| 3,523,258 | 8/1970 | Niemoeller et al. | 331/116 R |
| 3,569,865 | 3/1971 | Healey | 331/116 R |
| 3,982,210 | 9/1976 | Gehrke | 331/116 R X |

*Primary Examiner*—Siegfried H. Grimm
*Attorney, Agent, or Firm*—Gerald J. Ferguson, Jr.; Joseph J. Baker

[57] ABSTRACT

A quartz crystal oscillation circuit comprising an active oscillation element; a quartz crystal resonant element connected to the active oscillation element; first and second variable capacity diodes respectively connected in series and in parallel with the quartz crystal resonant element; and means connected to the quartz crystal resonant element for varying the frequency of the oscillation circuit.

5 Claims, 1 Drawing Figure

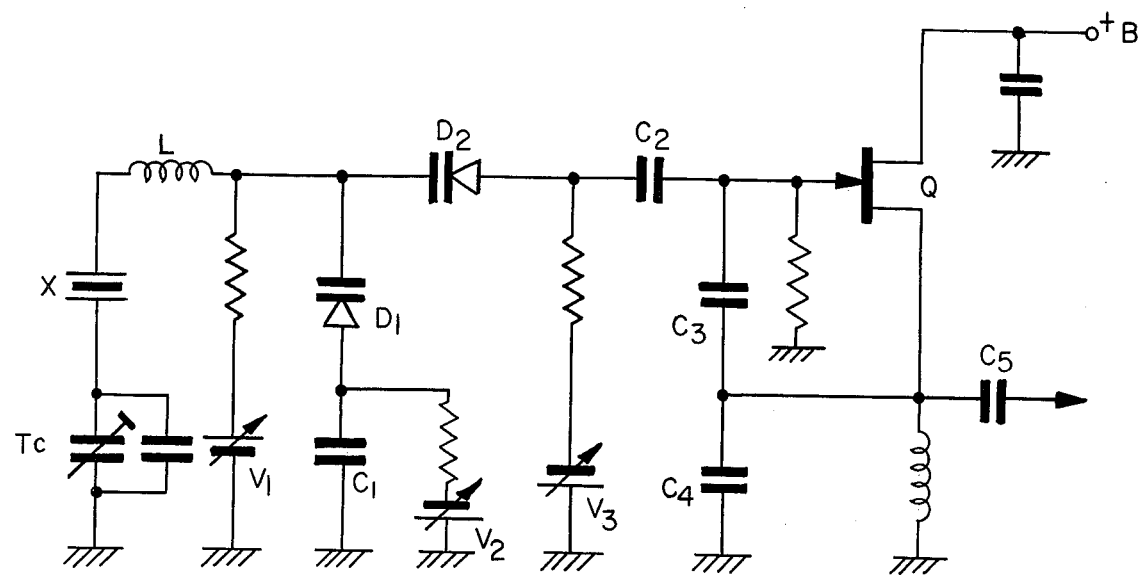

CRYSTAL OSCILLATING CIRCUIT

BACKGROUND OF THE INVENTION

1. Field of the Invention:

This invention relates to quartz crystal oscillation circuits.

2. Discussion of the Prior Art:

Commonly available quartz crystal oscillation circuits vary the oscillation frequency by employing a variable capacity diode as a part of the load circuit of the quartz crystal resonant element and by varying the bias voltage applied to the diode. The oscillation frequency can thus be varied by changing the load capacity. However, with the conventional quartz crystal oscillation circuits, the output amplitude fluctuates and further the output amplitude falls off when the load capacity varies greatly. Therefore, it is difficult to extensively vary the oscillation frequency. From a practical point of view, a sufficiently adjustable compensation circuit is also required in order to make up for frequency deviation induced by manufacturing processes. All of these factors reduce the operationally effective range of variable frequency. Therefore, it is almost impossible for a conventional oscillator to perform the receiver incremental tuning function in transceivers.

SUMMARY OF THE INVENTION

The present invention is an improvement over the above described circuitry and its object is to provide a quartz crystal oscillation circuit which fulfills the following conditions: oscillation frequency extensively variable with respect to voltage; no operational defects such as abnormal amplitude fluctuations of oscillations and fall off of oscillations with respect to frequency; and minimum fluctuation in oscillation output in order to achieve the receiver incremental tuning function — for example, in range of 5.0–5.5 MHz, even when the stationary channel is in operation.

BRIEF DESCRIPTION OF THE DRAWING

The sole FIGURE of the drawing is a circuit diagram illustrating a practical embodiment of the invention.

DETAILED DESCRIPTION OF THE PREFERRED EMBODIMENT OF THE INVENTION

A practical embodiment of this invention will now be described. In the drawing, Q is the active oscillation element of the oscillation circuit. A transistor or FET is used for this element. Oscillation feed back condensers $C_3$ and $C_4$ are connected to the gate of the FET Q. Condenser $C_2$ is connected between the gate of FET Q and variable capacity diodes $D_1$ and $D_2$, which are respectively connected in parallel and in series with a quartz crystal resonant element X. Bias voltage sources $V_2$ and $V_3$ are connected with variable capacity diodes $D_1$ and $D_2$ respectively. In this embodiment, reverse bias is applied. $V_1$ is the control voltage source for varying the frequency. L is a choke coil. Tc is a trimmer condenser for compensating the frequency of the quartz crystal resonant element. $C_1$ is a bypass condenser. $C_5$ is an over-all condenser. Briefly, the circuit varies the oscillation frequency by simultaneously connecting variable capacity diodes $D_1$ and $D_2$ in parallel and in series with the quartz crystal resonant element X, and changing the bias voltage applied to each of the variable capacity diodes.

With the circuit as described above, when control voltage $V_1$ for varying the oscillation frequency is decreased and the load capacity of quartz crystal resonant element X tends to increase, the amplitude of the oscillation output can be maintained almost the same due to the increase in the capacity of the variable capacity diode $D_2$ and the strengthened bond between the diode and the oscillation circuit in spite of the apparent slightly decreasing tendency of the oscillation output. Also, the load capacity of X is further increased by the variable capacity diode $D_2$. If, contrary to the above case, control voltage $V_1$ is raised, the load capacity of quartz crystal resonant element X tends to decrease, yet the oscillation output can still be maintained at a set value because of the increased capacity of variable capacity diode $D_1$ and the weakened bond between the diode and the oscillation circuit.

As indicated hereinabove, the following advantages are realized by this invention:

(a) Small fluctuation of output, and extensively variable frequency.
(b) Depending upon the selection of the bias voltages $V_2$ and $V_3$, the characteristic of voltage/frequency can be made close to a straight line.
(c) The trimmer condenser's frequency compensation range will be large.

What is claimed is:

1. A quartz crystal variable frequency oscillation circuit comprising
    an active oscillation element;
    a quartz crystal resonant element connected to said active oscillation element;
    first and second variable capacity diodes respectively connected in series and in parallel with said quartz crystal resonant element; and
    variable control voltage means connected to said first and second variable capacity diodes for applying variable control voltages to said variable capacity diodes and thereby varying the frequency of said oscillation circuit so that the amplitude of the output from said oscillation circuit remains substantially constant over a broad frequency range.

2. A variable frequency oscillating circuit as in claim 1 including a load impedance and where said active oscillation element includes a control terminal and at least one output terminal, said load impedance being connected between said output terminal and a reference potential terminal, said quartz crystal resonant element being connected across said control and reference potential terminals, said first variable capacity diode being connected in series with said quartz crystal element, said second variable capacity diode being connected in parallel with said quartz crystal element so that when the control voltages applied to variable capacity diodes are varied by said variable control voltage means, the load across said quartz crystal resonant element tends to remain constant and thus the said amplitude of said output from said oscillation circuit remains substantially constant over said broad frequency range.

3. A variable frequency oscillation circuit as in claim 2 where said first variable capacity diode is connected between said quartz crystal resonant element and said control terminal of said active oscillation element and said second variable capacity diode is connected from the junction between said first variable capacity diode and said quartz crystal resonant element to said reference voltage terminal.

4. A variable frequency oscillation circuit as in claim 1 where said active oscillation element is a field effect transistor.

5. A variable frequency oscillation circuit as in claim 1 including
a trimmer capacitor connected to said quartz resonant element for adjusting the resonant frequency of said quartz resonant element.

* * * * *